United States Patent [19]

Nozue

[11] Patent Number: 5,452,053
[45] Date of Patent: Sep. 19, 1995

[54] WAFER STEPPER
[75] Inventor: Hiroshi Nozue, Tokyo, Japan
[73] Assignee: NEC Corporation, Tokyo, Japan
[21] Appl. No.: 307,155
[22] Filed: Sep. 16, 1994
[30] Foreign Application Priority Data Sep. 16, 1993 [JP] Japan .................. 5-229353

[51] Int. Cl.6 .......................... G03B 27/72
[52] U.S. Cl. ........................ 355/53; 355/71
[58] Field of Search .................. 355/53, 71

[56] References Cited

U.S. PATENT DOCUMENTS 5,208,629 5/1993 Matsuo et al. .

FOREIGN PATENT DOCUMENTS 0090924 10/1983 European Pat. Off. .
0496891 8/1992 European Pat. Off. .
4343215 11/1992 Japan .
4369208 12/1992 Japan .
2212944 8/1989 United Kingdom .

*Primary Examiner*—Michael L. Gellner
*Assistant Examiner*—D. P. Malley
*Attorney, Agent, or Firm*—Sughrue, Mion, Zinn, Macpeak & Seas

[57] ABSTRACT

In a wafer stepper for fabricating semiconductor ICs (Integrated Circuits), a glass substrate carries thereon a plurality of octagonal patterns formed of a transmissive material. With such a glass substrate, the stepper diffracts light not only in X and Y directions but also in 45° directions and 135° directions. A mask pattern is transferred to a wafer with enhanced resolution and depth of focus.

7 Claims, 8 Drawing Sheets

WAFER STEPPER

BACKGROUND OF THE INVENTION

The present invention relates to a wafer stepper for fabricating semiconductor ICs (Integrated Circuits) and, more particularly, to a wafer stepper for forming a fine pattern on a semiconductor substrate accurately.

In the semiconductor ICs art, the degree of integration is quadrupling every three years, thanks to fine circuit pattern technologies. For example, to form a fine VLSI (Very Large Scale Integrated circuit) pattern on a semiconductor substrate, use is made of reduced-scale projection exposure capable of forming the fine pattern on the substrate accurately. A device for effecting the reduced-scale projection exposure is usually referred to as a wafer stepper, or simply stepper, and basically comprised of a mercury lamp or similar light source, reflector, first convex lens, fly's eye lens, aperture, second convex lens, a mask having a fine pattern, and a projection lens.

In the wafer stepper, light issuing from the light source is condensed by the reflector, uniformalized by the first convex lens and fly's eye lens, restricted by the aperture to a suitable size, and then incident to the mask via the second convex lens. The light incident to the mask is diffracted by a fine pattern, i.e., chromium pattern. As a result, zero order light, +first order light and −first order light are incident to the projection lens. Diffracted lights of second order and above advance in a direction angled more than the zero order diffracted light and are, therefore, usually not incident to the projection lens. The diffracted lights are focused onto a wafer or substrate and forms an aerial image identical with the chromium pattern in a reduced scale.

To meet the increasing demand for fine IC patterns, the stepper should be provided with an ability to expose finer patterns, i.e., resolution. The resolution R of a stepper is expressed by using the Rayleigh's equation, as follows:

$$R = K_1 \lambda/NA$$

where $\lambda$ is the wavelength of exposing light, NA is the aperture number of the projection lens, and K1 is a constant determined by resist performance. The above equation indicates that for higher resolution, it is necessary that the wavelength of the exposing light be reduced, or that the aperture number NA of the projection lens be increased. When the wavelength $\lambda$ is reduced, only excimer laser beams, including KrF excimer laser beam (249 nm) or ArF excimer laser beam (193 nm), are available-which have wavelengths shorter than that of the conventional g beam (463 nm) and i beam of a mercury lamp and have illumination necessary for exposure. However, the problem with an excimer laser is that it requires gas and parts to be replaced often. Moreover, this kind of laser is more than hundred times as expensive as a mercury lamp, increasing the cost of semiconductor ICs. Shorter wavelengths would make it difficult to design and fabricate projection lenses, among others, since optical parts, optical materials and resists having high transmittance are rare. On the other hand, the aperture number NA of the projection lens cannot be increased beyond a certain limit since increasing it results in a decrease in the depth of focus D. The depth of focus D is also determined by the Rayleigh's equation, as follows:

$$D = K_2 \lambda/(NA)^2$$

where K2 is a constant determined by a resist. It will be seen that the depth of focus D decreases in inverse proportion to the square of NA. Hence, NA cannot be increased beyond a certain limit.

To eliminate the above problems, two different exposing methods have been proposed. Specifically, Japanese Patent Laid-Open Publication No. 4-343215 discloses a method using a grating or similar optical element having a periodic structure or pattern located just above the mask, so that exposing light may be incident obliquely to the mask. In a device for implementing this oblique illumination, light incident to the optical element is diffracted by the periodic pattern of the optical element. The periodic pattern is so configured as to cancel zero order components. As a result, the +first order components and −first order components are incident to the mask. While three beams, i.e., zero order beam, +first order beam and −first order beam have customarily been focused onto the wafer due to the absence of the optical element, this stepper focuses two beams, i.e., +first order beam and −first order beam onto the wafer and, therefore, achieves a high resolution without reducing the depth of focus. Specifically, even if the aperture number NA of the projection lens is small, the resulting image appears as if it were exposed by a projection lens having a great aperture number. However, the stepper is operable only with the optical element having a checkerboard pattern, i.e., an arrangement of squares. The pattern is ineffective for 45° tilted features often used with semiconductor ICs, and moreover it lowers resolution and the depth of focus, obstructing the fabrication of ICs.

The other exposing method is taught in Japanese Patent Laid-Open Publication No. 4-369208. This method uses an aperture having an opening in: a peripheral portion thereof apart from the center. In this configuration, beams passed through the opening are incident obliquely to the mask. The opening of the aperture has an area which is less than one half of the area of a usual opening. As a result, the aperture needs an exposure time twice as long as that of the ordinary aperture in exposing the wafer. This makes it difficult to fabricate ICs at low cost.

SUMMARY OF THE INVENTION

It is, therefore, an object of the present invention to provide a wafer stepper which prevents the quantity of light from decreasing and enhances resolution and depth of focus even for 45° tilted features.

A wafer stepper for forming a predetermined pattern on a wafer of the present invention comprises illumination optics for condensing and uniformalizing light issuing from a light source, a glass substrate provided with a plurality of octagonal patterns for diffracting the uniformalized light from the illumination optics, a mask provided with the predetermined pattern and to which the diffracted light from the glass substrate is incident, and a projection lens for focusing the diffracted light from the mask onto the wafer to thereby form the predetermined pattern.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
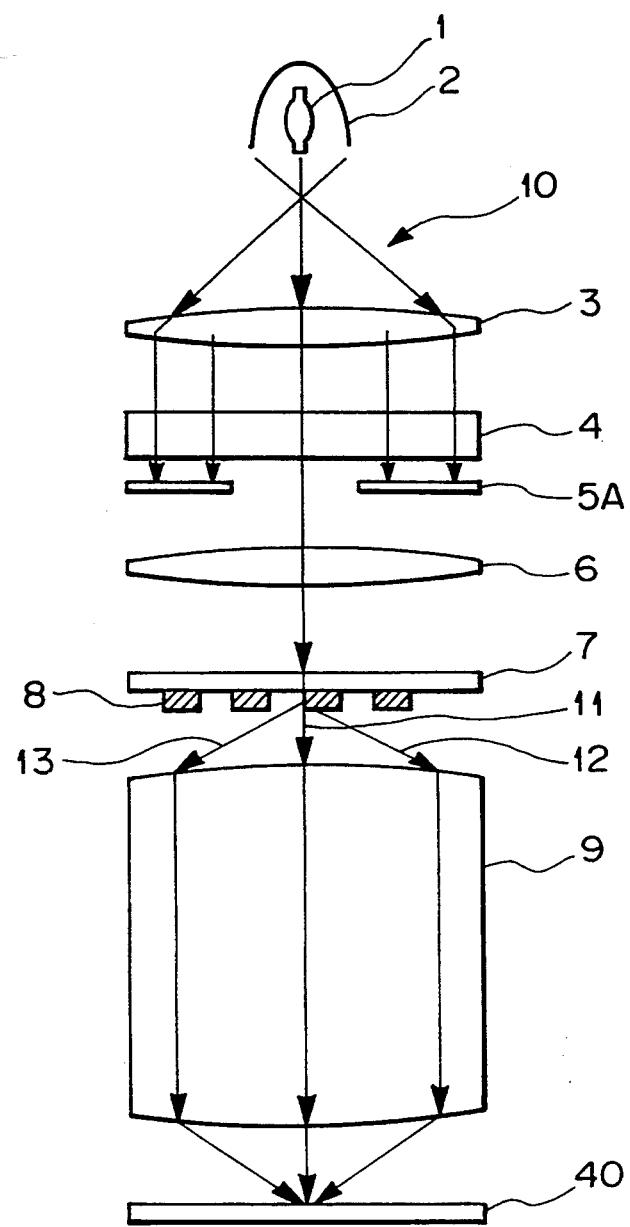
FIG. 1 shows a conventional wafer stepper.

To better understand the present invention, a brief reference will be made to a conventional wafer stepper, shown in FIG. 1. As shown, light 10 issuing from a mercury lamp or similar light source 1 is condensed by a reflector 2, uniformalized by a first convex lens 3 and a fly's eye lens 4, restricted by an aperture 5A to a suitable size, and then incident to a mask 7 via a second convex lens 6. The mask 7 carries a chromium pattern 8 thereon. The light 10 incident to the pattern 7 is diffracted by the chromium pattern 8. As a result, zero order light 11, +first order light 12 and −first order light 13 are incident to a projection lens 9. Diffracted lights of second order and above advance in a direction angled more than the zero order diffracted light and are, therefore, usually not incident to the projection lens 9. The diffracted lights 11–13 are focused onto a wafer or substrate 40 and forms an aerial image identical with the chromium pattern 8 in a reduced scale.

To enhance the ability of the stepper to expose finer patterns, i.e., resolution, it is necessary that the wavelength of the exposing light be reduced, or that the aperture number of the projection lens 9 be increased. However, to reduce the wavelength, the light source has to be implemented by an excimer laser beam, e.g., KrF excimer laser beam (249 nm) or ArF excimer laser beam (193 nm). The problem with an excimer laser is that it requires gas and parts to be replaced often. Moreover, this kind of laser is more than hundred times as expensive as a mercury lamp, increasing the cost of semiconductor ICs. Shorter wavelengths would make it difficult to design and fabricate projection lenses, among others, since optical parts, optical materials and resists having high transmittance are rare. On the other hand, the aperture number of the projection lens 9 cannot be increased beyond a certain limit since increasing it results in a decrease in the depth of focus.

Figure 2A:
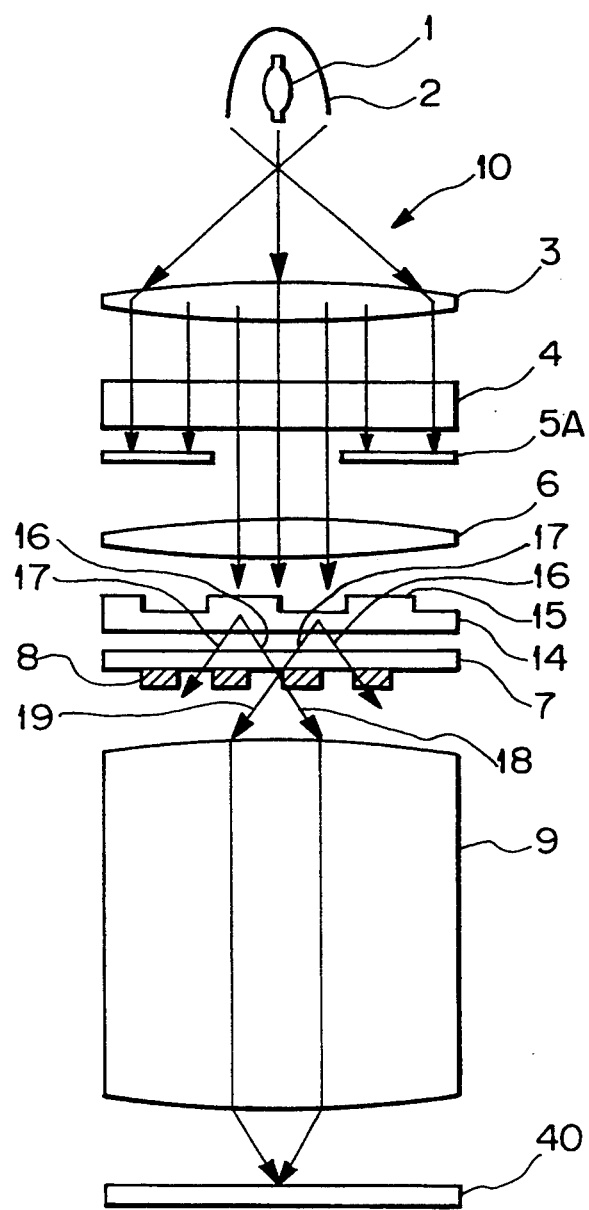
FIG. 2A shows another conventional wafer stepper.
Figure 2B:
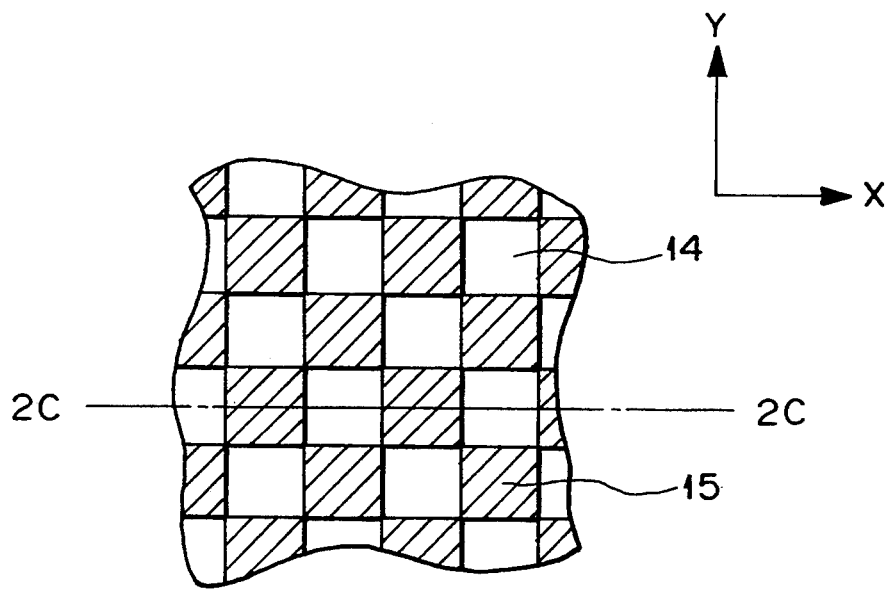
FIG. 2B is a plan view of an optical element included in the stepper of FIG. 2A.
Figure 2C:
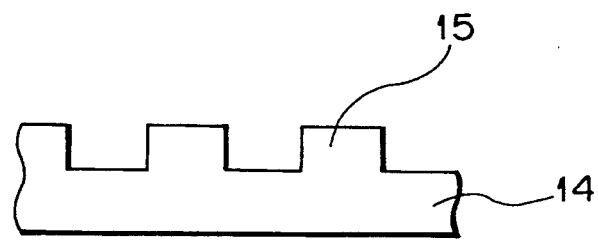
FIG. 2C is a section along line 2C–2C of FIG. 2B.

FIGS. 2A–2C show another conventional wafer stepper constituting an improvement over the stepper of FIG. 1 and disclosed in the previously mentioned Japanese Patent Laid-Open Publication No. 4-343215. Briefly, the improved stepper includes a grating or similar optical element having a periodic structure or pattern located just above the mask 7, so that exposing light may be incident obliquely to the mask 7. Specifically, the stepper of FIGS. 2A–2C has an optical element 14 in addition to the constituent parts of the stepper of FIG. 1. The light 10 incident to the optical element 14 is diffracted by a periodic pattern 15 provided on the optical element 14. The periodic pattern 15 is so configured as to cancel zero order components. As a result, the +first order components 16 and −first order components 17 are incident to the mask 7. These components 16 and 17 incident to the mask 7 are again diffracted by the chromium pattern 8. At this instant, the zero order components and +first order components resulting from the +first order components 16 and −first order components 17, respectively, are superposed to turn out a beam of light 18. At the same time, the −first order components and zero order components resulting from the +first order components 16 and −first order components 17, respectively, are superposed to turn out a beam of light 19. These beams 18 and 19 are incident to the projection lens 9 and then focused onto the wafter 40. In the stepper of FIG. 1, the three beams, i.e., zero order beam, +first order beam and −first order beam are focused onto the wafer 40 due to the absence of the optical element 14. In contrast, the stepper of FIGS. 2A–2C focuses two beams, i.e., +first order beam and −first order beam onto the wafer 40 and, therefore, achieves a high resolution without reducing the depth of focus. Specifically, even if the aperture number of the projection lens 9 is small, the resulting image appears as if it were exposed by a projection lens having a great aperture number.

A specific configuration of the optical element 14 is shown in FIGS. 2B and 2C. As shown, a checkerboard pattern is formed on the optical element 14 so as to enhance the resolution of the pattern 8 of the mask 7 in the X and Y directions. However, the resolution of the pattern 8 is lowered in the directions other than X and Y. A periodic pattern capable of enhancing the resolution in the directions other than X and Y has not be reported yet.

Figure 3A:
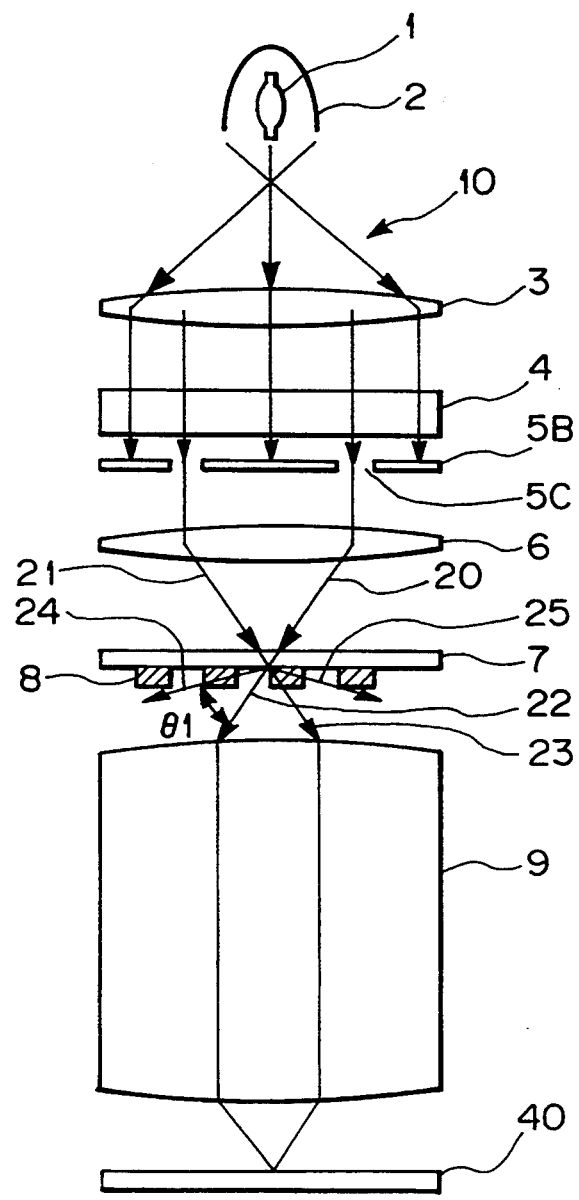
FIG. 3A shows still another conventional wafer stepper.

FIGS. 3A shows another conventional wafer stepper also constituting an improvement over the stepper of FIG. 1 and taught in the previously mentioned Japanese Patent Laid-Open Publication No. 4-369208. Briefly, the improvement comprises a deformed aperture opening for implementing oblique illumination. As shown, an aperture 5B has an opening 5C in a peripheral portion thereof apart from the center. In this configuration, beams 20 and 21 passed through the opening 5C are incident obliquely to the mask 7. Among the diffraction components derived from the beam 20, the zero order components 22 and +first order components 23 are incident to the projection lens 9, but the −first order components 24 are not incident thereto. The zero order components resulting from the beam 21 are superposed on the +first order components 23 and incident to the projection lens 9 as a beam 23. Also, the −first order components are superposed on the zero order components resulting from the beam 20 and incident to the lens 9 as a beam 22. The plus first order components 25 are not incident to the lens 9. The beams 22 and 23 are focused onto the wafer 40 by the lens 9. The prerequisite with this type of stepper is that the zero order components and −first order components resulting from the beams 20 and 21, respectively, be superposed on each other, and the +first order components and zero order components resulting from the beams 20 and 21 be superposed on each other. The angle $\theta_1$ between the zero order beam light and the ±first order light changes depending on the pitch of the chromium pattern provided on the mask 7, as follows:

$$\sin \theta_1 = \lambda/P$$

Therefore, when the mask 7 is replaced with another in order to expose a pattern of different dimensions, the aperture 5B has to be replaced with another having an opening at a particular position capable of setting up an optimal diffraction angle. This is also true with the optical element 14 of FIGS. 2A–2C.

Figure 3B:
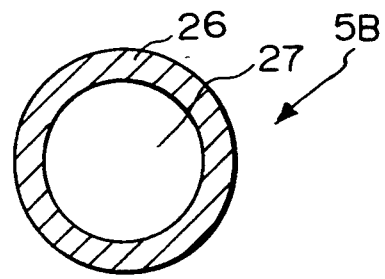
FIGS. 3B–3E are plan views each showing a specific aperture.
Figure 3C:
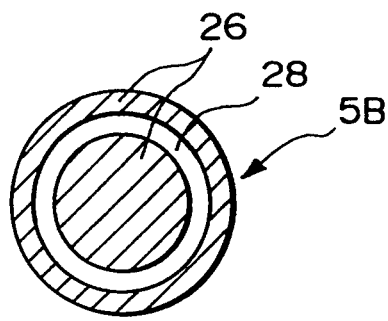
Figure 3D:
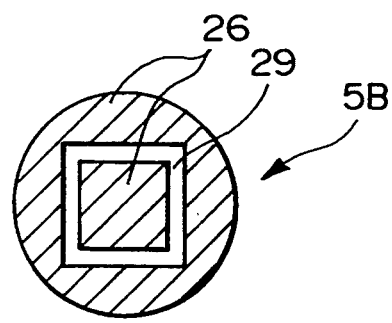
Figure 3E:
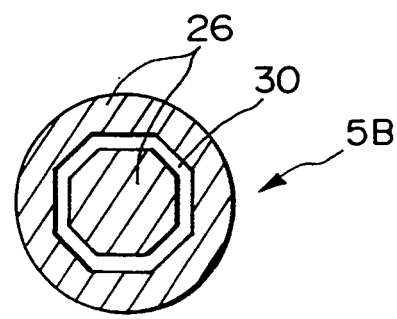

FIGS. 3B–3E each shows a specific configuration of the aperture 5B usable with the stepper of FIG. 3A. FIG. 3B shows an ordinary aprture while FIGS. 3C–3E show apertures available for oblique illumination. Specifically, the aperture 5B of FIG. 3C has an annular opening and enhances resolution for patterns of any direction. The aperture 5B of FIG. 3D has a square opening and exhibits its function only for patterns of directions X and Y. Further, the aperture 5B of FIG. 3E has an octagonal opening and enhances resolution for patterns of directions X and Y and 45° tilted directions. Each aperture 5B has a screening portion 26 and an opening 27, 28, 29 or 30.

The conventional oblique illumination type wafer steppers shown in FIGS. 2A–2C and 3A–3C have critical problems, as discussed earlier. Specifically, the stepper of FIGS. 2A–2C is operable only with the optical element 14 having the checkerboard pattern 8, i.e., an arrangement of squares. The pattern 8 is ineffective for 45° tilted features often used with semiconductor ICs, and moreover it lowers resolution and the depth of focus, obstructing the fabrication of ICs. The stepper of FIGS. 3A–3E has the aperture 5B formed with the opening 5C whose area is less than one half of the area of the usual opening. As a result, the aperture 5B needs an exposure time twice as long as that of the ordinary aperture in exposing the wafer 40. This makes it difficult to fabricate ICs at low cost.

Figure 4:
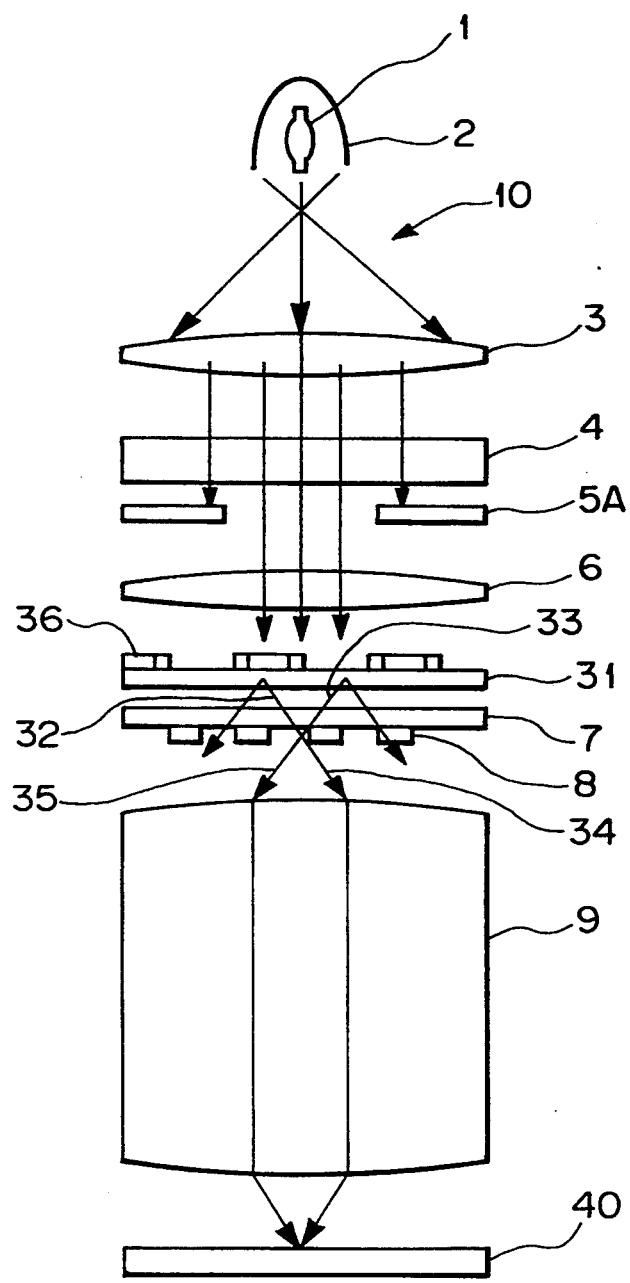
FIG. 4 shows a wafer stepper embodying the present invention.

Referring to FIG. 4, a wafer stepper embodying the present invention is shown. In the figure, the same or similar constituent parts as or to the parts included in the conventional steppers are designated by the same reference numerals, and a detailed description thereof will not be made in order to avoid redundancy. As shown, light 10 issuing from a light source 1 is condensed by a reflector 2, routed through a lens 3 and a fly's eye lens 4, and then incident to an aperture 5A. The aperture 5A restricts the light 10 to an adequate size. A projection lens 6 projects the restricted light onto a glass substrate 31 on which a plurality of octagonal patterns are formed by a transmissive material. The glass substrate 31 enhances the ±first order components with the result that major beams 32 and 33 are incident to a mask 7. A chromium pattern 8 provided on the mask 7 diffracts the incident lights. As a result, the zero order components and +first order components resulting from the beams 32 and 33, respectively, are superposed to turn out light 34. Likewise, the −first order components and zero order components resulting from the beams 32 and 33, respectively, are superposed to turn out light 35. The lights 34 and 35 are focused onto a wafer 40 via a lens 9.

Figure 5A:
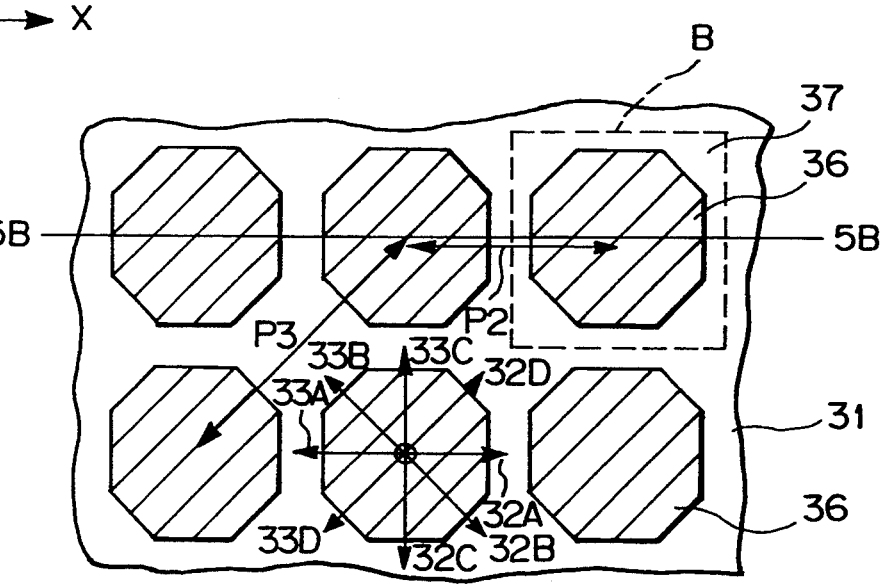
FIG. 5A is a plan view of a glass substrate included in the embodiment.
Figure 5B:
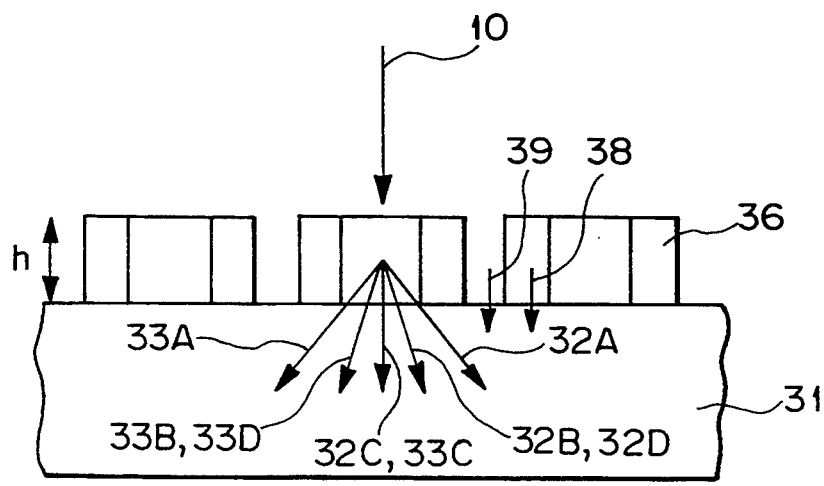
FIG. 5B is a section along line 5B—5B of FIG. 5A.

FIGS. 5A and 5B show the configuration of the glass substrate 31 specifically. As shown, octagonal patterns 36 are formed on the glass substrate 31 by SOG (Spin On Glass). The light 10 incident to the glass substrate 31 is diffracted by the octagonal patterns, or SOG patterns, 36 with the result that the first order components appear in eight different directions. At this instant, the +first order components 32A and −first order components 33A are effective for features of X orientation; the +first order components 32C and −first order components 33C are effective for features of Y orientation; the +first order components 32D and −first order components 33D are effective for 45° tilted features; and the +first order components 32B and −first order components 33B are effective for 45° tilted features perpendicular to 32D and 33D. These ±first order components are incident obliquely to the mask 7. The effect of such oblique illumination is maximized when the zero order components 38 and 39 advancing in the same direction as the light 10 are fully cancelled. To maximize the effect, it is necessary that the beam 38 passed through the SOG patterns 36 and the beam 39 not passed through it be inverted in phase and be equal in intensity to each other. Specifically, assume that the SOG patterns 36 each has a height h expressed as:

$$h = \lambda/2(n-1)$$

where $\lambda$ and n are respectively the wavelength of the exposing light and the refractive index of the SOG patterns 36. Then, the beams 38 and 39 are inverted in phase. Also, if each SOG pattern 36 and a portion 37 surrounding it within a region B are provided with the same area, the beams 38 and 39 are equal in intensity to each other. However, if the SOG patterns 36 absorb the incident light, the area of each SOG pattern 36 should be increased to compensate for the decrease in the intensity of the beam 38. It is not necessary to fully cancel the zero order components at all times; the height or the size of the SOG patterns 36 and, therefore, the intensity of the zero order components may be suitably adjusted to implement exposure intermediate between the ordinary exposure and the oblique illumination exposure.

Figure 6:
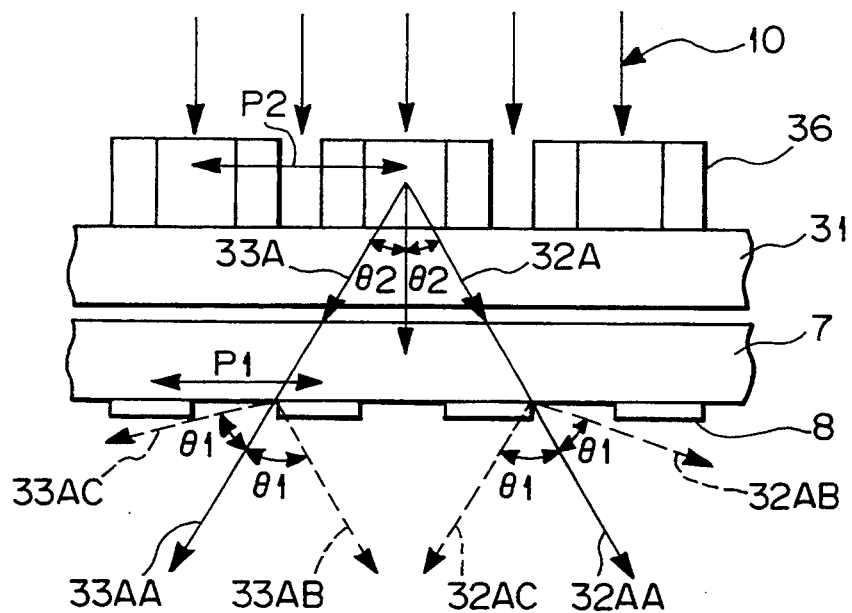
FIG. 6 is a section showing a glass substrate and a mask also included in the embodiment.

As to the dimensions of the SOG patterns 36, the effect of the oblique illumination is not attainable unless the angle between the ±first order components and the zero order components are adjusted. This will be described with reference to FIG. 6 showing the glass substrate 31 and mask 7. The description will concentrate on the X direction diffraction components 32A and 33A for simplicity. The diffracted light 32A is again diffracted by the chromium pattern 8 to turn out the zero order beam 32AA, +first order beam 32AB, and −first order beam 32AC. The zero order beam 32AA and −first order beam 32AC contribute to focusing, but the +first order beam 32AB is not incident to the projection lens 9. The diffracted light 33A is transformed to the zero order beam 33AA, +first order beam 33AB and −first order beam 33AC by the chromium pattern 8; only the beams 33AA and 33AB contribute to focusing. The effect of oblique illumination is maximized when the zero order beam 32AA and +first order beam 33AB advance in the same direction and the −first order beam 32AC and zero order beam 33AA advance in the same direction. For this purpose, there should hold a relation:

$$P2 = P1 \sin \theta_1 / \sin \theta_2 = P1(\sin \theta_1 / \sin(\theta_1/2)) \approx 2P1$$

where P1 is the pitch of the chromium pattern 7, P2 is the pitch of the SOG patterns 36, $\theta_1$ is the angle between the zero order beam and the ±first order beams produced by the chromium pattern 8, and $\theta_2$ is the angle between the zero order beam and the ±first order beams produced by the SOG patterns 36. The above relation indicates that resolution is enhanced most if the pitch of the SOG patterns 36 is twice as great as the pitch of the chromium pattern 8. Since the chromium pattern 8 on the mask 7 usually has several different sizes, the SOG patterns 36 should preferably have several different sizes also. In such a case, it is not necessary for the SOG patterns 36 having different sizes be arranged periodically, i.e., they may be arranged at random. Further, illumination intermediate between the ordinary illumination and the oblique illumination is achievable only if the pitch of the SOG patterns 36 is one half to five times as great as the pitch of the chromium pattern 8.

While the octagonal patterns 36 are implemented by SOG, they may be implemented by any other suitable material or even by treating the glass substrate 31.

Figure 7:
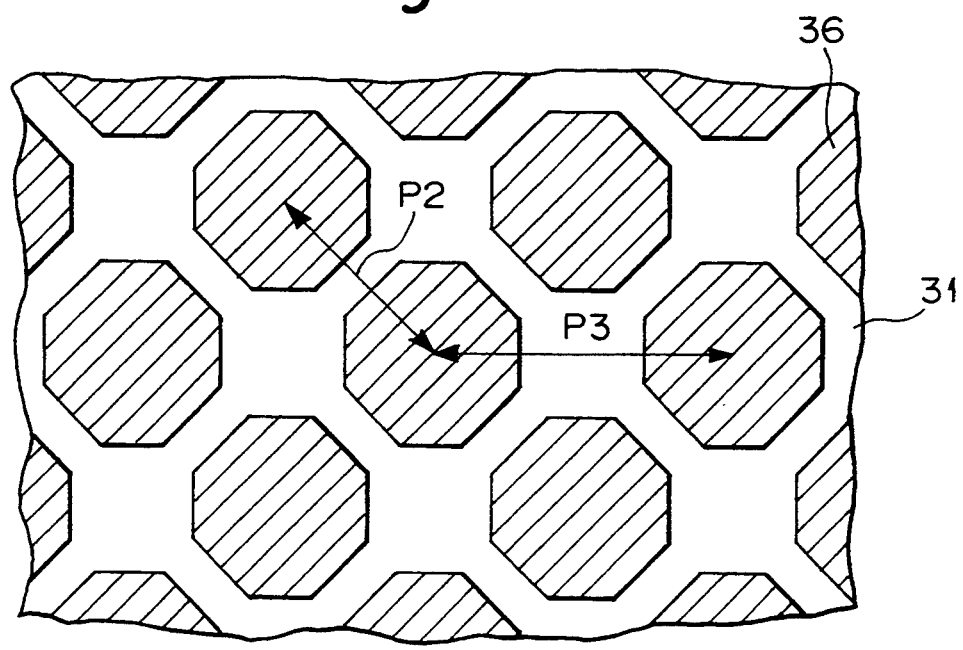
FIG. 7 is a plan view of a glass substrate representing an alternative embodiment of the present invention.

FIG. 7 shows an alternative embodiment of the present invention. In the previous embodiment, the octagonal patterns 36 are arranged at the pitch P2 in the X and Y directions and at the pitch P2 in the 45° titled directions, as shown in FIG. 5A. In contrast, in this embodiment, the pitch is P3 in the X and Y directions and P2 in the 45° tilted directions. In this way, the arrangement of the octagonal patterns 36 may be so changed as to match various kinds of X, Y and 45° tilted features. This can be done by rotating the glass substrate 31 45° or by using another glass substrate.

In summary, in accordance with the present invention, a wafer stepper includes in illumination optics thereof a glass substrate on which a plurality of octagonal patterns are formed by used of a transmissive material. The stepper, therefore, prevents the quantity of light from decreasing and enhances resolution and depth of focus not only for X and Y features but also for 45° tilted features, thereby implementing high performance semiconductor devices at low cost.

Various modifications will become possible for those skilled in the art after receiving the teachings of the present disclosure without departing from the scope thereof.

What is claimed is:

1. A wafer stepper for forming a predetermined pattern on a wafer, comprising:
   illumination optics for condensing and uniformalizing light issuing from a light source;
   a glass substrate provided with a plurality of octagonal patterns for diffracting uniformalized light from said illumination optics;
   a mask provided with said predetermined pattern and to which diffracted light from said glass substrate is incident; and
   a projection lens for focusing diffracted light from said mask onto said wafer to thereby form said predetermined pattern.

2. A wafer stepper as claimed in claim 1, wherein said glass substrate is made of a transmissive material.

3. A wafer stepper as claimed in claim 2, wherein said transmissive material comprises SOG (Spin On Glass).

4. A wafer stepper as claimed in claim 1, wherein said illumination optics comprises a fly's eye lens for uniformalizing the light from said light source, and an aperture for restricting uniformalized light from said fly's eye lens to a predetermined size.

5. A wafer stepper as claimed in claim 1, wherein said predetermined pattern on said mask is formed of chromium.

6. A wafer stepper as claimed in claim 1, wherein said octagonal patterns on said glass substrate have a pitch having a predetermined relation to a pitch of said predetermined pattern on said mask.

7. A wafer stepper as claimed in claim 6, wherein in said predetermined relation, the pitch of said octagonal patterns is one half to five times as great as the pitch of said predetermined pattern.

* * * * *